(12) United States Patent
Larson et al.

(10) Patent No.: US 7,875,824 B2
(45) Date of Patent: Jan. 25, 2011

(54) QUARTZ GUARD RING CENTERING FEATURES

(75) Inventors: Dean J. Larson, Pleasanton, CA (US); Daniel Brown, Dublin, CA (US); Keith Comendant, Fremont, CA (US); Victor Wang, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 814 days.

(21) Appl. No.: 11/701,507

(22) Filed: Feb. 2, 2007

(65) Prior Publication Data

US 2008/0099120 A1    May 1, 2008

Related U.S. Application Data

(60) Provisional application No. 60/852,344, filed on Oct. 16, 2006.

(51) Int. Cl.
*B23K 10/00* (2006.01)

(52) U.S. Cl. .............. 219/121.43; 219/121.4; 219/121.44; 219/121.59; 118/723 R; 156/345.34

(58) Field of Classification Search ............. 219/121.4, 219/121.41, 121.43, 121.44; 118/723 R, 118/723 I; 156/345.47, 345.48, 345.34; 315/111.51
See application file for complete search history.

(56) References Cited

U.S. PATENT DOCUMENTS

| | | | |
|---|---|---|---|
| 5,074,456 A * | 12/1991 | Degner et al. | ............... 228/121 |
| 5,534,751 A | 7/1996 | Lenz et al. | |
| 5,997,962 A | 12/1999 | Ogasawara et al. | |
| 6,073,577 A | 6/2000 | Lilleland et al. | |
| 6,824,627 B2 | 11/2004 | Dhindsa et al. | |
| 6,838,012 B2 * | 1/2005 | Lenz | ............... 216/71 |
| 6,890,861 B1 | 5/2005 | Bosch | |
| 7,244,311 B2 * | 7/2007 | Fischer | ............... 118/725 |
| 7,267,741 B2 * | 9/2007 | Ren | ............... 156/345.1 |
| 7,645,341 B2 * | 1/2010 | Kennedy et al. | ............... 118/715 |

FOREIGN PATENT DOCUMENTS

JP    17-019508 A    1/2005

OTHER PUBLICATIONS

International Search Report and Written Opinion dated Mar. 24, 2008 for PCT/US2007/021629.

* cited by examiner

*Primary Examiner*—Mark H Paschall
(74) *Attorney, Agent, or Firm*—Buchanan Ingersoll & Rooney PC (57) ABSTRACT

An electrode assembly and method of centering an outer ring around an electrode assembly in a plasma reaction chamber used in semiconductor substrate processing. The method includes positioning the outer ring around an outer surface of a backing member of the electrode assembly, and inserting at least one centering element between the outer ring and the backing member. The centering element can be a plurality of spring-loaded centering elements received in a cavity on the outer surface of the backing member, the centering elements having a first end adapted to contact the outer ring and a second end adapted to receive a spring. The outer ring surrounds an outer surface of the backing member, such that the plurality of spring-loaded centering elements are positioned between the outer surface of the backing member and an inner surface of the outer ring.

21 Claims, 10 Drawing Sheets

QUARTZ GUARD RING CENTERING FEATURES

CROSS-REFERENCE TO RELATED APPLICATION

This application claims priority to U.S. Patent Provisional Application No. 60/852,344 filed Oct. 16, 2006, which is incorporated herein by this reference in its entirety.

SUMMARY

In accordance with one embodiment, an electrode assembly for a plasma reaction chamber used in semiconductor substrate processing comprises: an upper electrode; a backing member, the backing member attachable to an upper surface of the upper electrode; an outer ring surrounding an outer surface of the backing member; and at least one centering element positioned between the outer surface of the backing member and an inner surface of the outer ring.

In accordance with a further embodiment, a guard ring assembly for use in an electrode assembly of a plasma reaction chamber used in semiconductor substrate processing wherein the electrode assembly includes a showerhead electrode bonded to a backing member and a confinement ring assembly surrounds the electrode assembly, the guard ring assembly comprises: a guard ring configured to fit between an outer periphery of the backing member and an inner periphery of the confinement ring assembly; and at least one centering element adapted to center the guard ring around the backing member.

In accordance with another embodiment, a method of centering a guard ring around a backing member of an electrode assembly wherein the backing member is bonded to an electrode used to generate plasma in a plasma reaction chamber used in semiconductor substrate processing, the method comprises: positioning the guard ring around an outer surface of the backing member; and inserting at least one centering element between the guard ring and the backing member so as to center the guard ring around the backing member.

DETAILED DESCRIPTION

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, HBr, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls. The etching reactor electrodes may often be fabricated by bonding two or more dissimilar members with mechanically compliant and/ or thermally conductive adhesives, allowing for a multiplicity of function.

Figure 1:
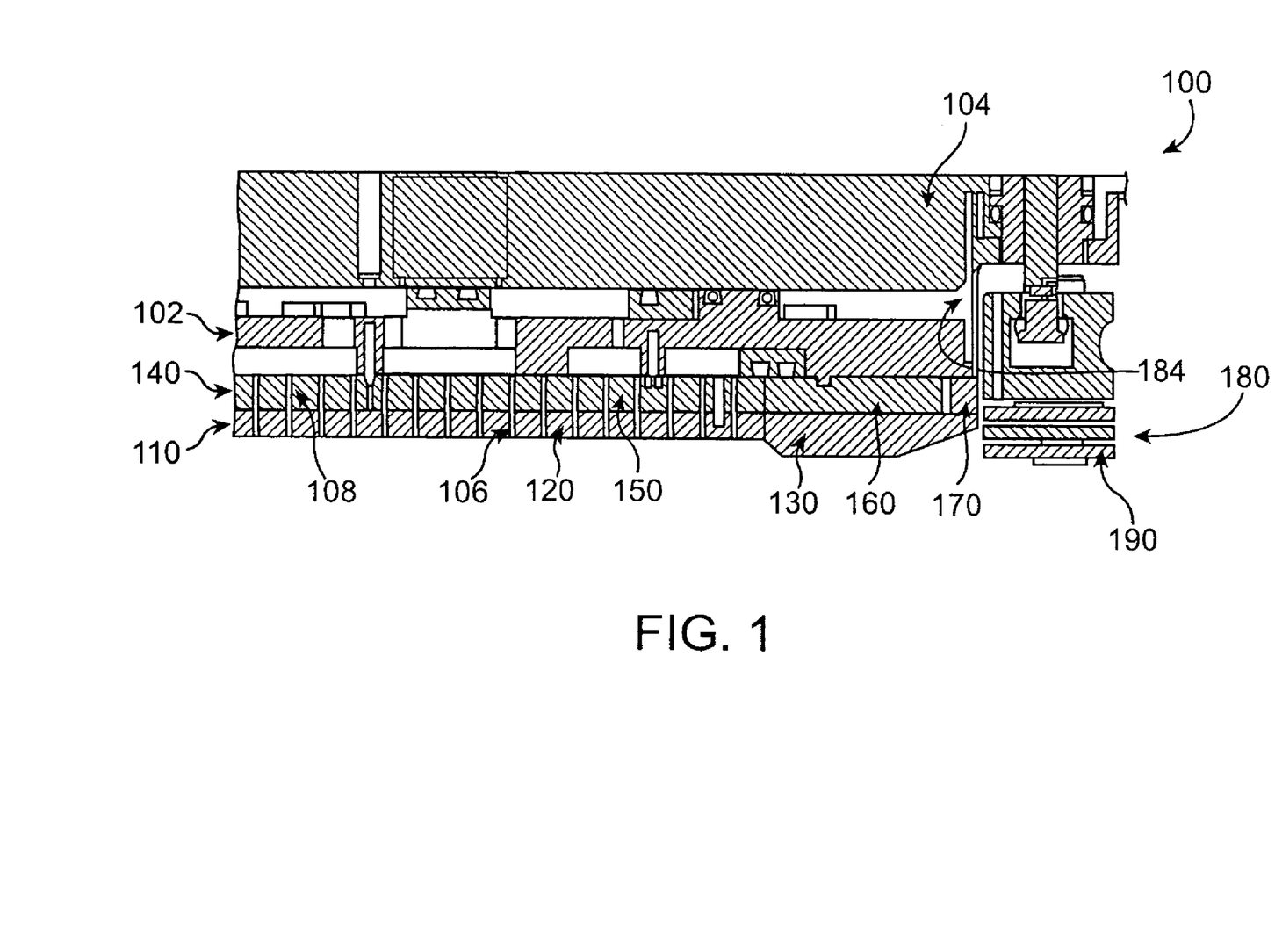
FIG. 1 shows a cross-sectional view of a showerhead electrode assembly of a plasma reactor for etching substrates having a guard ring.

FIG. 1 shows a cross-sectional view of a portion of a showerhead electrode assembly 100 of a plasma processing system for etching substrates. As shown in FIG. 1, the showerhead electrode assembly 100 includes an upper electrode 110, a backing member 140, and an outer ring 170 in the form of a guard ring. The showerhead electrode assembly 100 also includes a plasma confinement assembly (or wafer area plasma (WAP) assembly) 180, which surrounds the outer periphery of the upper electrode 110 and the backing member 140. The outer ring or guard ring 170 surrounds the backing member 140 and preferably is adapted to be concentrically positioned or centered around the backing member 140, such that during use the guard ring 170 minimizes the variation or distance between the guard ring 170 and the confinement assembly 180. It can be appreciated that although the outer ring or guard ring 170 is shown in conjunction with a reactive ion etching system, the guard ring and centering features can be used with any suitable system including a clean-etch system or a dry etch system.

The assembly 100 also includes a thermal control member 102, and an upper plate 104. The upper electrode 110 preferably includes an inner electrode 120, and an optional outer electrode 130. The inner electrode 120 is preferably a cylindrical plate and may be made of single crystal silicon. The backing member 140 is preferably secured to the inner electrode 120 and the outer electrode 130 with an elastomeric material. The backing member 140 can include an inner backing member 150, and an optional outer backing member 160. If the backing member 140 is comprised of a single cylindrical plate, the guard ring 170 surrounds the backing member 140. Alternatively, if the backing member 140 is a comprised of an inner and an outer backing member 150, 160, the guard ring 170 is adapted to surround the outer backing member 160.

The showerhead electrode assembly 100 as shown in FIG. 1 is typically used with an electrostatic chuck (not shown) having a flat lower electrode on which a wafer is supported spaced 1 to 2 cm below the upper electrode 110. An example of such a plasma processing system is a parallel plate type reactor, such as the Exelan® dielectric etch systems, made by Lam Research Corporation of Fremont, Calif. Such chucking arrangements provide temperature control of the wafer by supplying backside helium (He) pressure, which controls the rate of heat transfer between the wafer and the chuck.

The upper electrode 110 is a consumable part which must be replaced periodically. In a preferred embodiment, the upper electrode 110 is a showerhead electrode provided with a plurality of spaced apart gas discharge passages 106, which are of a size and distribution suitable for supplying a process gas, which is energized by the electrode and forms plasma in a reaction zone beneath the upper electrode 110.

The showerhead electrode assembly 100 also includes a plasma confinement assembly (or wafer area plasma (WAP) assembly) 180, which surrounds the outer periphery of the upper electrode 110 and the backing member 140. The plasma confinement assembly 180 is preferably comprised of a stack or plurality of spaced-apart confinement rings 190, which surrounds the outer periphery of upper electrode 110 and the backing member 140. During processing, the plasma confinement assembly 180 causes a pressure differential in the reaction zone and increases the electrical resistance between the reaction chamber walls and the plasma thereby confining the plasma between the upper electrode 110 and the lower electrode (not shown).

The confinement of the plasma to the reaction chamber is a function of many factors including the spacing between the confinement rings 190, the pressure in the reaction chamber outside of the confinement rings and in the plasma, the type and flow rate of the gas, as well as the level and frequency of RF power. For effective plasma confinement, the pressure outside the confinement rings 190 should be as low as possible, preferably less than 30 millitorr. Confinement of the plasma is more easily accomplished if the spacing between the confinement rings 190 is very small. Typically, a spacing of 0.15 inches or less is required for confinement. However, the spacing of the confinement rings 190 also determines the pressure of the plasma, and it is desirable that the spacing can be adjusted to achieve the pressure required for optimal process performance while maintaining plasma. Process gas from a gas supply is supplied to electrode 110 through one or more passages in the upper plate 104. The gas then is distributed through one or more vertically spaced apart baffle plates and passes through gas distribution holes 106 in the electrode 110 to evenly disperse the process gas into reaction zone 102.

The inner electrode 120 is preferably a planar disk or plate having a uniform thickness from center (not shown) to an outer edge. It can be appreciated that the inner electrode 120 can have a diameter smaller than, equal to, or larger than a wafer to be processed, e.g., up to 300 mm, if the plate is made of single crystal silicon, which is the maximum diameter of currently available single crystal silicon material. For processing 300 mm wafers, the outer electrode 130 is adapted to expand the diameter of the upper electrode 110 from about 15 inches to about 17 inches. The outer electrode 130 can be a continuous member (e.g., a poly-silicon member, such as a ring), or a segmented member (e.g., 2-6 separate segments arranged in a ring configuration, such as segments of single crystal silicon). The inner electrode 120 preferably includes multiple gas passages 106 for injecting a process gas into a space in a plasma reaction chamber below the upper electrode 110.

Single crystal silicon is a preferred material for plasma exposed surfaces of the inner electrode 120 and the outer electrode 130. High-purity, single crystal silicon minimizes contamination of substrates during plasma processing as it introduces only a minimal amount of undesirable elements into the reaction chamber, and also wears smoothly during plasma processing, thereby minimizing particles. Alternative materials that can be used for plasma-exposed surfaces of the upper electrode 110 include SiC, SiN, and AlN, for example.

In configurations, the showerhead electrode assembly 100 is large enough for processing large substrates, such as semiconductor wafers having a diameter of 300 mm. For 300 mm wafers, the upper electrode 110 is at least 300 mm (millimeter) in diameter. However, the showerhead electrode assembly 100 can be sized to process other wafer sizes or substrates having a non-circular configuration.

Figure 2:
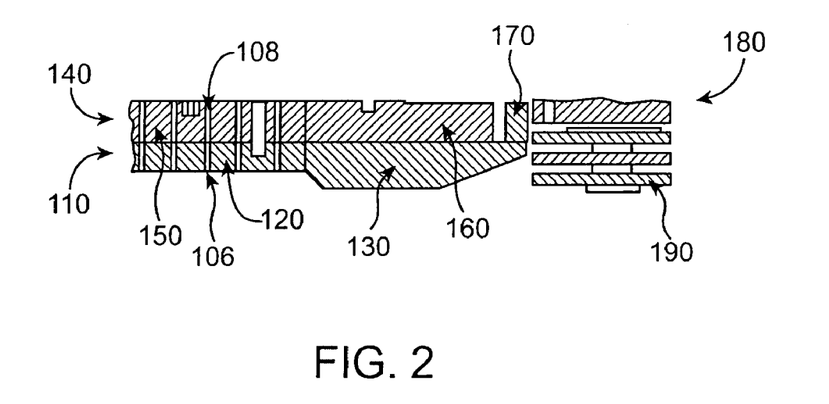
FIG. 2 shows a cross-sectional view of a portion of the showerhead electrode assembly of FIG. 1.

FIG. 2 shows a cross-sectional view of a portion of the showerhead electrode assembly of FIG. 1 having a guard ring 170. As shown in FIG. 2, the showerhead electrode assembly 100 includes the inner electrode 120, the inner backing member 150, the outer electrode 130, the outer backing member 160, the guard ring 170, and the plasma confinement assembly 180. In such configurations, the inner electrode 120 is preferably co-extensive with the inner backing member 150, and the outer electrode 130 is essentially co-extensive with the surrounding backing member 160. However, the inner backing member 150 can extend beyond the inner electrode 120 such that the backing member 140 (FIG. 3) can be a single disk or plate that is used to support the inner electrode 120 and the outer electrode 130. The inner backing member 150 includes gas passages 108 aligned with the gas passages 106 in the inner electrode 120 to provide gas flow into the plasma-processing chamber. The gas passages 108 of the inner backing member 150 typically have a diameter of about 0.04 inches, with the gas passages 106 of the inner electrode 120 typically having a diameter of about 0.025 inches.

The backing member 140, including the inner and the outer backing member 150, 160, are preferably made of a material that is chemically compatible with the process gases used for processing semiconductor substrates in the plasma processing chamber. In addition, the material of the backing member 140 is preferably electrically and thermally conductive with a coefficient of thermal expansion closely matching that of the upper electrode 110. Preferred materials that can be used to make the backing member 140, including the inner and outer backing members 150, 160 can include, but are not limited to, graphite, SiC, aluminum (Al), or other suitable materials.

The inner electrode 120 and the outer electrode 130 are preferably attached to the inner and outer backing members 150, 160 with a thermally and electrically conductive elastomeric bonding material (not shown). The elastomeric bonding material allows for relative movement between the upper electrode 110 and the backing member 140 during thermal stresses due to thermal cycling. The bonding material also transfers heat and electrical energy between the inner and the outer electrodes 120, 130 and the inner and the outer backing members 150, 160. The use of elastomeric bonding material for bonding together surfaces of an electrode assembly 100 is described, for example, in commonly owned U.S. Pat. No. 6,073,577, which is incorporated herein by reference in its entirety.

The inner backing member 150 and the outer backing member 160 are preferably attached to the thermal control member 102 with suitable fasteners, which can be threaded bolts, screws, or the like. For example, bolts (not shown) can be inserted in holes in the thermal control member 102 and screwed into threaded openings in the backing member 140. The thermal control member 102 includes a flexure portion 184 and is preferably made of a machined metallic material, such as aluminum, an aluminum alloy or the like. The upper plate 104 is preferably made of aluminum or an aluminum alloy. The plasma confinement assembly (or wafer area plasma assembly (WAP)) 180 is positioned outwardly of the showerhead electrode assembly 100. The suitable plasma confinement assembly 180 including the plurality of vertically adjustable plasma confinement rings 190 is described in commonly owned U.S. Pat. No. 5,534,751, which is incorporated herein by reference in its entirety.

Figure 3:
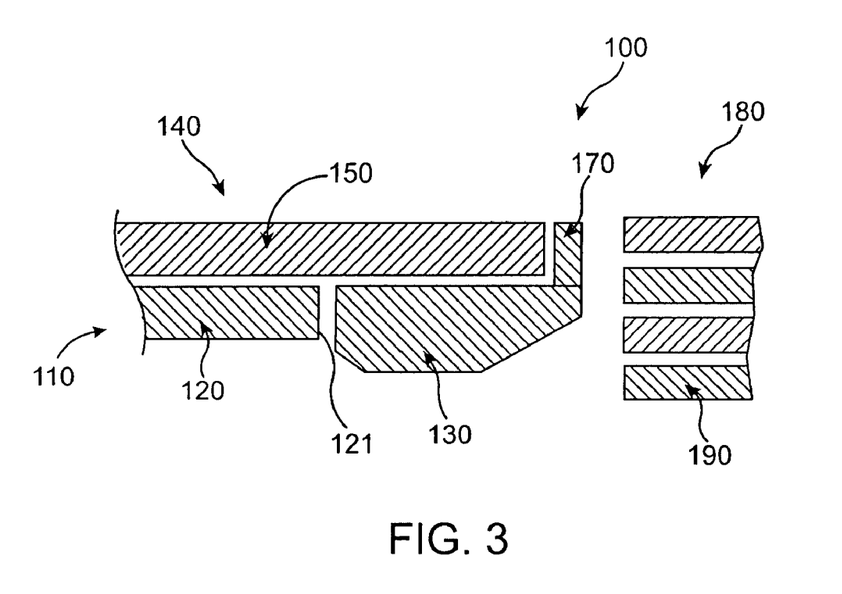
FIG. 3 shows a cross-sectional view of a portion of the showerhead electrode assembly of FIG. 2 comprising an upper electrode, a backing member and a guard ring.

FIG. 3 shows a cross-sectional view of a portion of the showerhead electrode assembly of FIG. 2 comprising an upper electrode 110 having an inner electrode 120 and an outer electrode 130, a backing member 140 comprised of a single disk or plate, and a guard ring 170. As shown in FIG. 3, the backing member 140 can be adapted to extend beyond an outer edge 121 of the inner electrode 120, such that a single backing member 140 can be used instead of an inner backing member 150 and an outer backing member 160 as shown in FIG. 2. The outer edge 121 of the inner electrode 120 is typically vertical as shown in FIG. 3. However, it can be appreciated that the outer edge 121 of the inner electrode 120 can have an orientation, which is not vertical.

In accordance with one embodiment, the outer electrode 130 is preferably comprised of a plurality of segments, wherein the segments are attached to one another with an elastomeric bonding material (not shown). The plurality of segments allow for the expansion of the outer electrode 130 during processing of a semiconductor substrate in the processing zone 102. During processing, heat is transferred from the inner electrode 120 and the outer electrode 130 to the inner backing member 150, the outer backing member 160, and the guard ring 170, and then to the upper plate 104 via thermal conduction.

Figure 4:
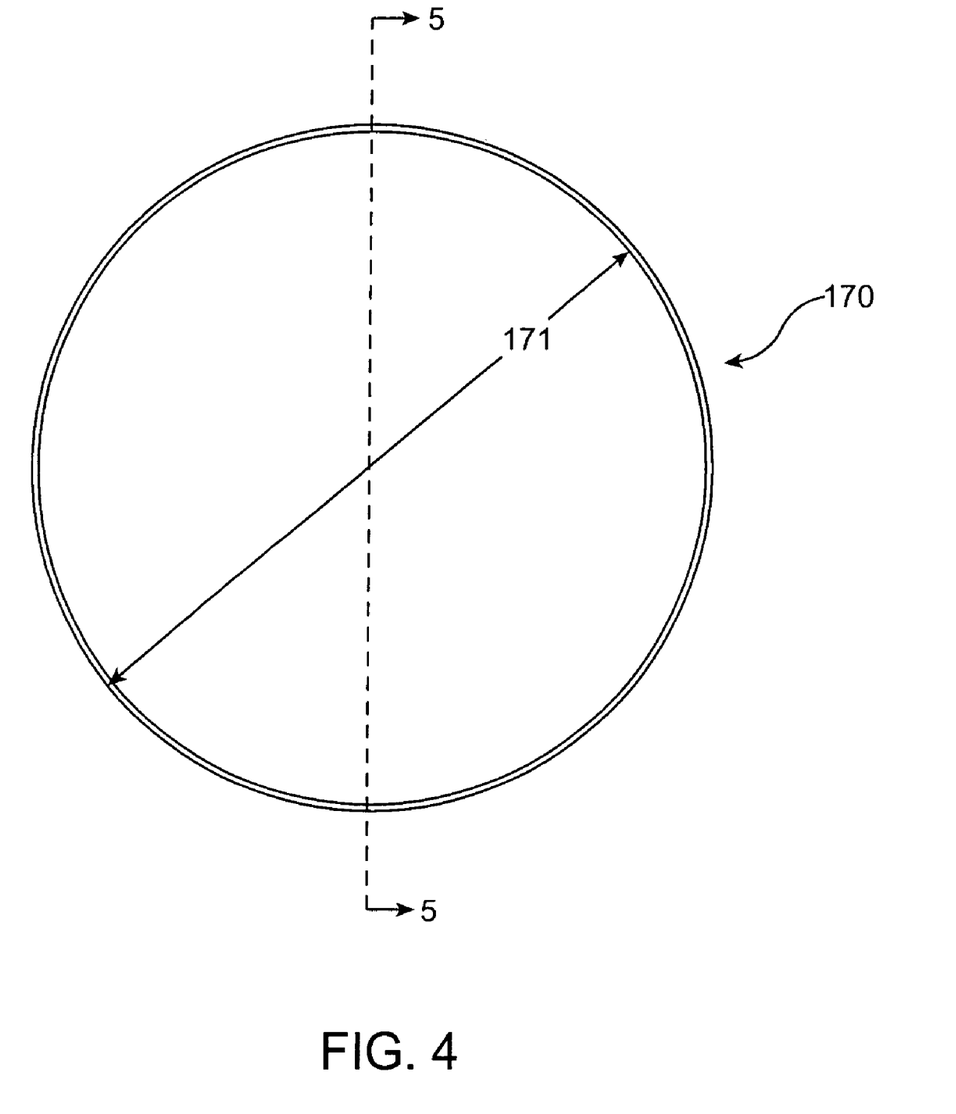
FIG. 4 shows a top view of the guard ring.
Figure 5:
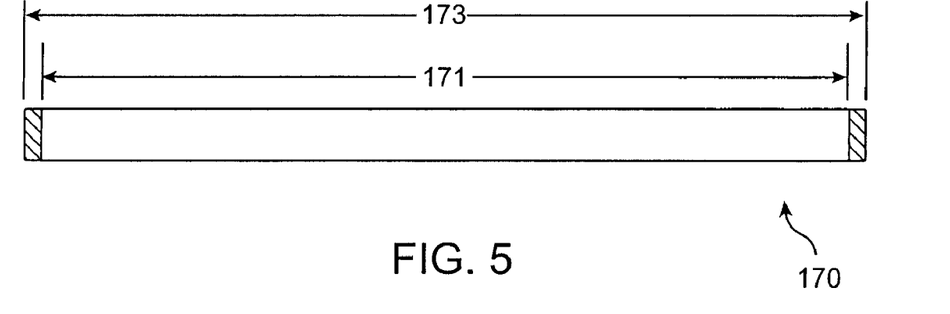
FIG. 5 shows a cross-sectional view of the guard ring of FIG. 4 along the line 5-5.

FIG. 4 shows a top view of a guard ring 170 in accordance with one embodiment. As shown in FIG. 4, the guard ring 170 is preferably circular having an inner diameter 171 and an outer diameter 173 (FIG. 5). It can be appreciated that the inner and outer diameters 171, 173 of the guard ring 170 will vary depending on the outer diameter of the backing member 140 including the outer diameter of the outer backing member 160. The guard ring 170 is preferably made from the same material (e.g., quartz), or materials having a similar coefficient of thermal expansion (CTE), as the neighboring wafer area plasma (WAP) confinement rings 190, and which is dimensionally stable over a broad temperature range. The guard ring 170 is also preferably made from a material, which has electrically insulative and/or dielectric properties. It can be appreciated that during use or operation of the plasma chamber, the guard ring 170 preferably expands and/or contracts at a similar rate as the plurality of confinement rings 190. Thus, a consistent radial gap 244 (FIG. 7) can be preferably maintained between the guard ring 170 and the plurality of confinement rings 190 over a broad temperature range, which provides consistent gas flow performance.

FIG. 5 shows a cross-sectional view of the guard ring 170 of FIG. 4 along the line 5-5. As shown in FIG. 5, the guard ring 170 is circular having an inner diameter 171 and an outer diameter 173.

Figure 6:
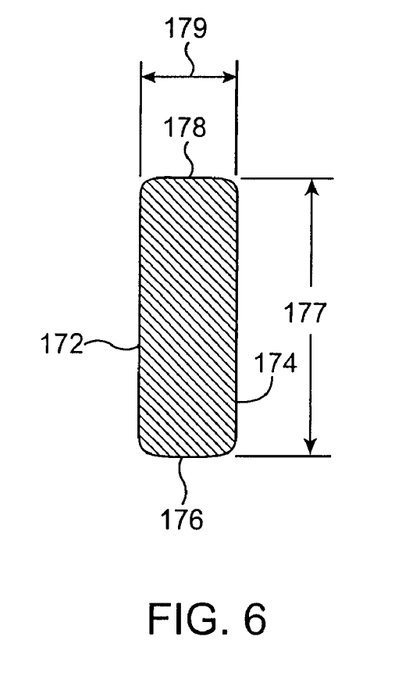
FIG. 6 shows a cross-sectional view of the guard ring in accordance with one embodiment.

FIG. 6 shows a cross-sectional view of the guard ring 170 in accordance with one embodiment. As shown in FIG. 6, the guard ring 170 preferably has a rectangular cross-section comprised of an inner edge 172, an outer edge 174, a lower surface 176 and an upper surface 178. The corners between the inner edge 172, the outer edge 174, the lower surface 176, and the upper surface 178 are preferably rounded having a radius of between about 0.025 and 0.010.

In accordance with one embodiment, the inner edge 172 and the outer edge 174 preferably have a height 177 of about 0.380 to 0.394 inches, and more preferably about 0.384 to 0.390 inches and most preferably about 0.387 inches, and a width 179 of about 0.140 to 0.150 inches, and more preferably about 0.142 and 0.147 inches, and most preferably about 0.145 inches.

Figure 7:
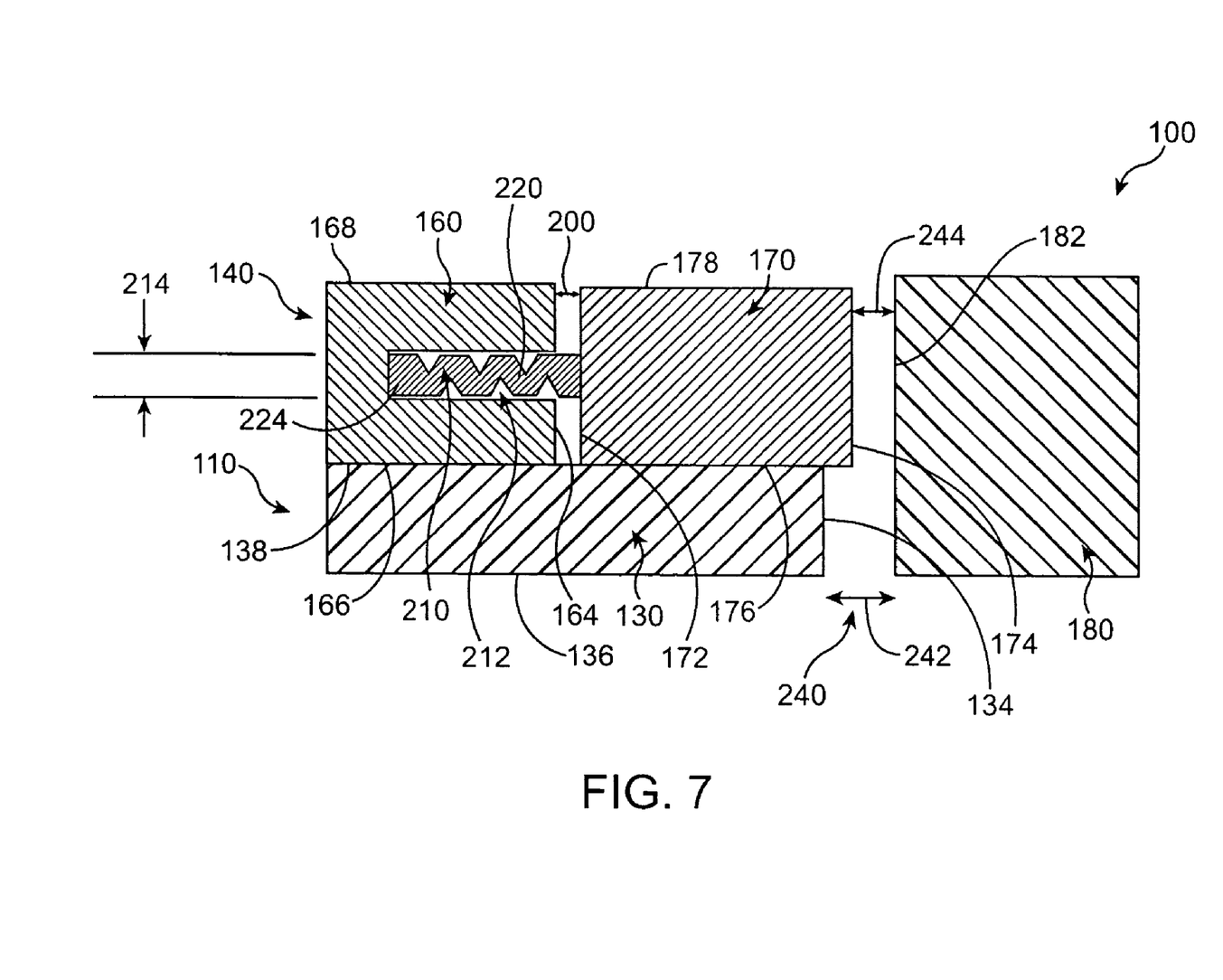
FIG. 7 shows a cross-sectional view of a portion of the outer electrode having a guard ring in accordance with another embodiment.

FIG. 7 shows a cross-sectional view of a portion of an outer electrode 110 having a guard ring 170 with a centering element 210 in accordance with one embodiment. As shown in FIG. 7, the guard ring 170 surrounds the outer backing member 160 and is preferably configured to be concentrically positioned or centered around an outer edge 164 of the outer backing member 160. It can be appreciated that the centering of the guard ring 170 can compensate for coefficient of thermal expansion mismatches between the upper electrode 110, the backing member 140 including the inner backing member 150 and the outer backing member 160, and the plasma confinement assembly 180 including the plasma confinement rings 190 during operation and/or use.

In accordance with one embodiment, as shown in FIG. 7, the guard ring 170 can be centered on the outer edge 164 of the outer backing member 140 using a suitable centering element 210 with a spring-loaded centering element 220. The spring-loaded centering element 220 is preferably comprised of a hollow cylinder 252 (FIG. 9), which houses a spring or spring-like element 224. The outer backing member 160 preferably includes a plurality of holes or cavities 212, which are adapted to receive the centering element 210 creating an inner gap 200 between the outer edge 164 of the outer backing member 160 and the inner edge 172 of the guard ring 170. The holes or cavities 212 have a diameter 214, which is slightly larger than the outer diameter of the centering element 210. The centering element 210 seeks to create an equilibrated load between the outer backing member 160 and the inner edge 172 of the guard ring 170, which centers the guard ring 170 on the outer edge 164 of the outer backing member 160.

The spring or spring-like element 224 can be a cantilevered leaf spring, a dual support leaf spring, an open ended radial travel helical coils, a rocking radial cylindrical plunger or other suitable spring-like element. It can be appreciated that the spring or spring-like element 224 preferably possesses a low spring rate to minimize bending and stress in the guard ring 170. However, the spring or spring-like element 224 also preferably includes a high enough spring rate to overcome any system friction. It can be appreciated that the spring or spring-like element 224 can alternatively be a suitable elastic material. In accordance with one embodiment, the spring or spring-like element 224 can be made of stainless steel, inconel, or other suitable metallic spring or other suitable material having elastic properties, such that the spring or spring-like element 224 can support various loads over a defined area.

In addition, as shown in FIG. 7, a radial gap (or outer gap) 240 exists between the upper electrode 110 and backing member 140, and the plasma confinement assembly 180. The radial gap or outer gap can include a lower radial gap 242 and an upper radial gap 244. The lower radial gap 242 is between the outer edge 134 of the outer electrode 130 and the inner edge 182 of the confinement assembly 180. The upper radial gap 244 is between the outer edge 174 of the guard ring 170 and the inner edge 182 of the confinement assembly 180. The upper radial gap 244 is preferably maintained at a consistent distance, such that the system 100 is operable over a broad temperature range, which provides consistent gas performance during use and provides the system 100 with improved performance. It can be appreciated that as a result of different materials typically being used for the upper electrode 110, the confinement rings 190, and the backing member 140, the lower radial gap 242 can vary during operation of the system.

The centering elements 210 seek to create an equilibrated load between the outer backing member 160 and the inner edge 172 of the guard ring 170, by centering the guard ring 170 on the outer edge 164 of the outer backing member 160 during thermal expansion and/or contraction of the upper electrode 110, the backing member 140 and the guard ring 170. In use, the centering elements 210 are preferably equally spaced at three or more symmetrically angular locations around the outer edge 164 of the backing member 140.

The centering of the circular guard ring 170 around the backing member 140 also provides the system 100 with uniformity by avoiding process gas flow variation within the system during use or processing. In addition, by eliminating any off-center resistance between the outer backing member 140 and the guard ring 170 with a self-centering correction element in the form of a plurality of centering elements 210, the system 100 can maintain concentricity from radial bump loads during system assembly. In addition, it can be appreciated that the natural vibration of the system 100 can be used to center the guard ring 170 around the upper electrode backing member 140.

The guard ring 170 can also minimize or eliminate the possibility of localized electrical arcing or light-up between the guard ring 170 and the plasma confinement assembly 180 (or WAP) or confinement rings 190, and the guard ring 170 and the upper electrode backing member 140.

The centering elements 210 are also preferably configured to provide sufficient clearance between the outer backing member 160 and the guard ring 170 to avoid binding and to concentrically align the guard ring 170 and the upper electrode backing member 140. The spring or spring-like element 224 also allows the guard ring 170 to axially support itself on the upper surface 138 of the upper electrode 110 (or outer electrode 130), which eliminates an axial gap under the guard ring 170. It can be appreciated that by eliminating the axial gap, the guard ring 170 can shield the bond or bond material between the upper electrode 110 and the backing member 140 from free radical and ion bombardment erosion during use. In addition, by allowing the guard ring 170 to support itself on the upper electrode surface 138, the guard ring 170 also protects the backing member 140, including the inner backing member 150 and the outer backing member 160 including the outer backing member's outer surface 164 from free radical and ion bombardment exposure from the plasma, and associated aluminum fluoride formation.

It can be appreciated that the centering element 210 can also incorporate mechanical elements that prevent or minimize compression set and prevent exposed metallic materials, such as the stainless steel springs. In addition, the centering element 210 is preferably made of low-friction materials, which avoids sticking of contacting parts or elements. The centering elements 210 are also preferably designed, such that the elements 210 are dimensional and temperature tolerant, ergonomically friendly to assemble/disassemble, geometrically as simple as possible to minimize manufacturing cost, and utilize low cost and chemically inert materials.

Figure 8:
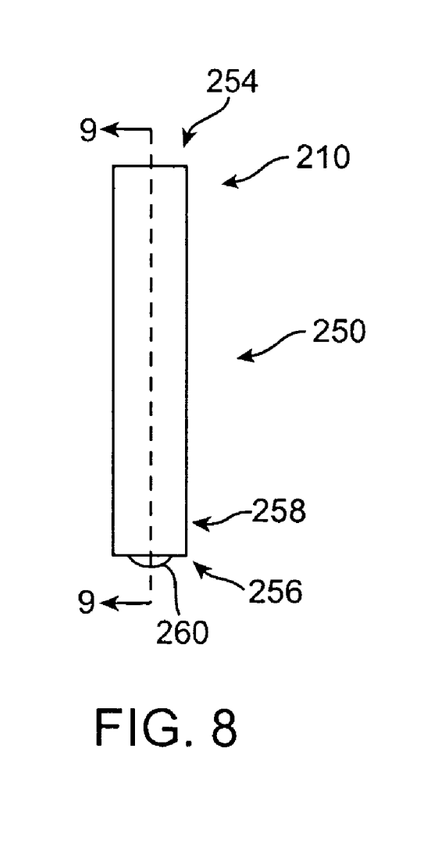
FIG. 8 shows a side view of a centering element in accordance with one embodiment.

FIG. 8 shows a side view of a centering element 210 having a reticulating ball or roller tip assembly 250 in accordance with one embodiment. As shown in FIG. 8, the reticulating ball or roller tip assembly 250 is comprised of a hollow cylinder 252 (FIG. 9) having a first end 254 and a second end 256. The first end 254 is open to receive a spring or spring-like element 224 (FIG. 7). The second end 256 has a ball receiving portion 258 adapted to receive a ball 260. The ball 260 is retained within the ball receiving portion 258 and is adapted to be rotate within the ball receiving portion 258 as needed upon contact with the guard ring 170.

The reticulating ball or roller tip assembly 250 is preferably made of a fluoropolymer, such as Teflon® (or polytetrafluoroethylene (PTFE)). However, it can be appreciated, that the reticulating ball or roller tip assembly 250 can be made of a polyetheretherketone or polyketones (PEEK), a polyimide, such as Vespel™, or other suitable polymeric material. It can be appreciated that if a PTFE material cannot be utilized due to other factors, a material with the lowest coefficient of friction is preferred.

Figure 9:
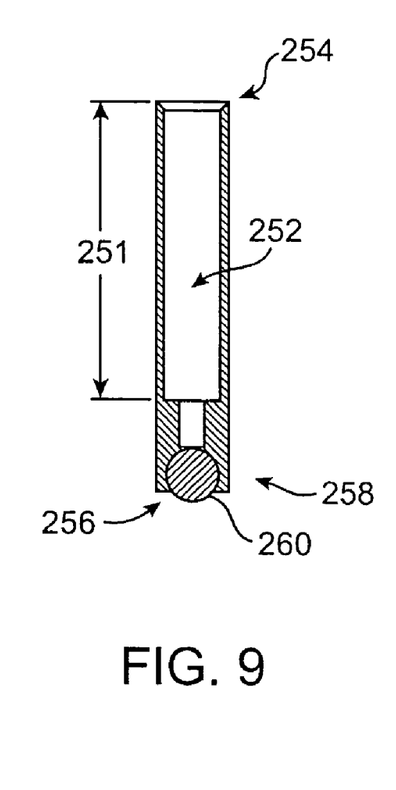
FIG. 9 shows a cross-sectional view of the centering element of FIG. 8 along the line 9-9.

FIG. 9 shows a cross-sectional view of the roller tip assembly 250 of FIG. 8 along the line 9-9. As shown in FIG. 9, the roller tip assembly 250 is comprised of a hollow cylinder 252 having a first end 254, a second end 256, and a ball receiving portion 258. The ball receiving portion 258 receives a rotatable ball (or reticulating ball) 260, which is held securely within the second end 256 of the roller tip assembly 250.

Figure 10:
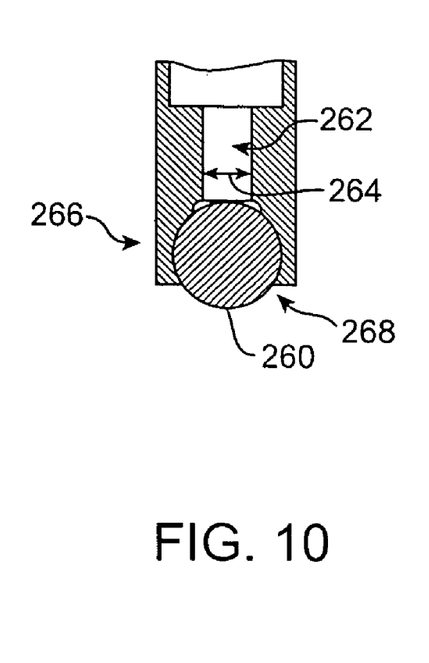
FIG. 10 shows a cross-sectional view of a portion of the centering element of FIG. 8.

FIG. 10 shows a cross-sectional view of a portion of the centering element 210 of FIG. 8. As shown in FIG. 10, the ball receiving portion 258 of the roller ball assembly 250 is adapted to receive a ball 260. The ball receiving portion 258 includes an upper portion 262 having a first diameter 264 and a lower portion 266 having a generally spherical or semispherical cavity 268, which is adapted to receive the ball 260. The ball 260 is generally spherically in shape and upon contact with an object, such as the guard ring 170, the ball 260 rotates within the spherical or semi-spherical cavity 268. The rotation of the ball 260 within the spherical or semi-spherical cavity 268 centers the guard ring 170 around an outer edge 164 of the outer backing member 160 during movement of the upper electrode 110, the backing member 140 and the plasma confinement assembly 180 due to movement of the system from thermal expansion of the upper electrode 110, the backing member 140 and the plasma confinement assembly 180.

Figure 11:
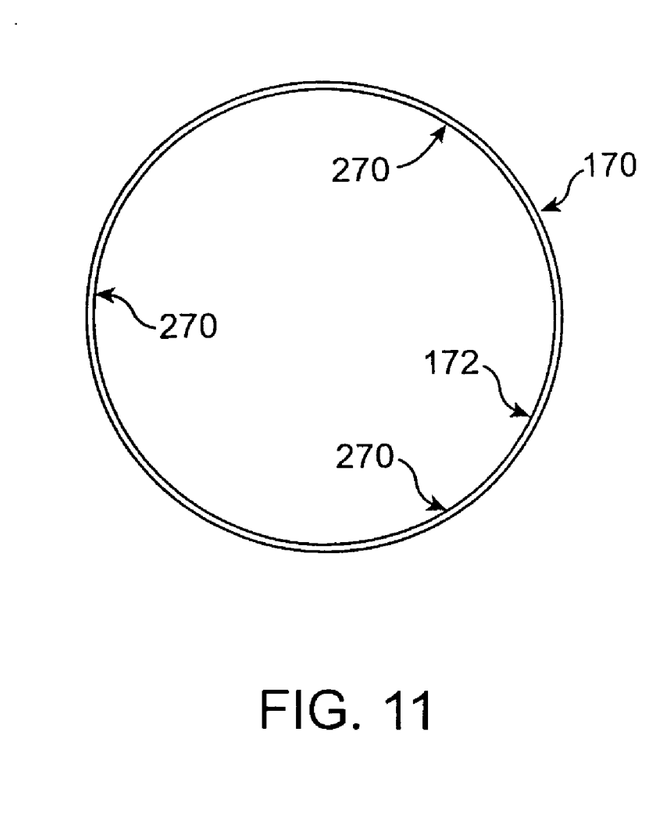
FIG. 11 shows a top view of the outer ring in accordance with one embodiment.
Figure 13:
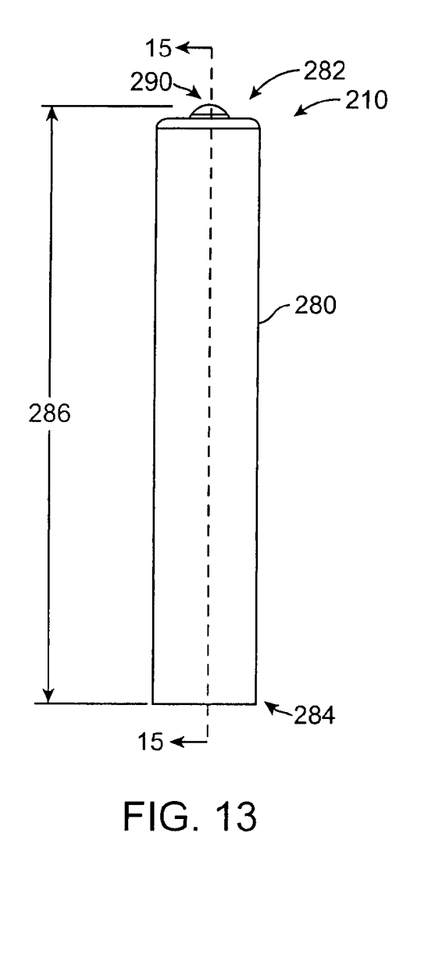
FIG. 13 shows a cross-sectional view of a centering element in accordance with another embodiment.
Figure 14:
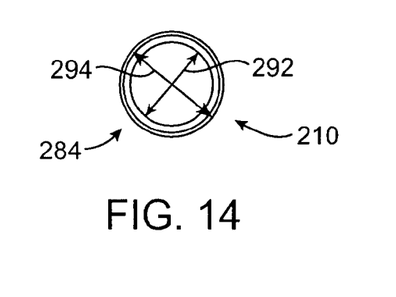
FIG. 14 shows a bottom view of the centering element of FIG. 13.
Figure 15:
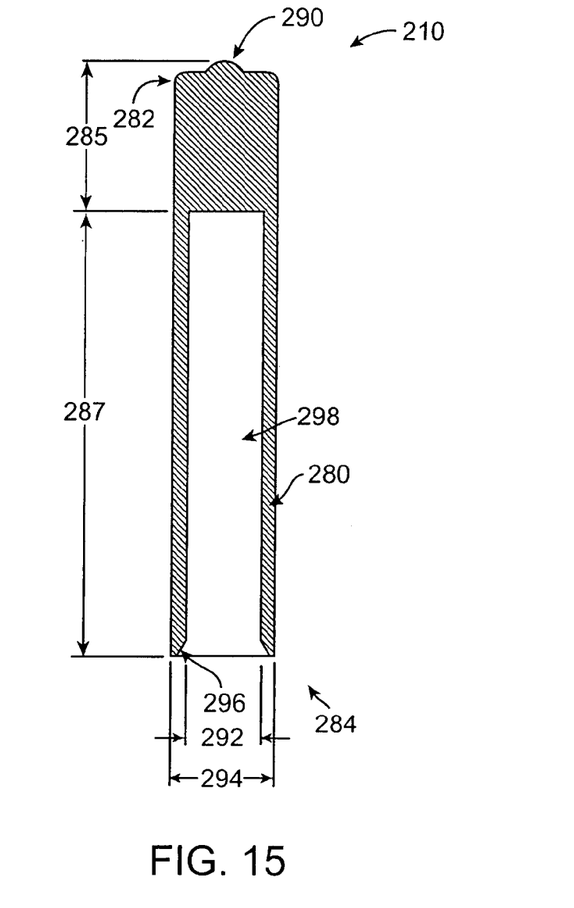
FIG. 15 shows a cross-sectional view of the centering element of FIG. 13 along the lines 15-15.

FIG. 11 shows a top view of the outer ring 170 in accordance with another embodiment. As shown in FIG. 11, the guard ring 170 can include at least three sockets or bores 270 on an inner edge 172 of the guard ring 170. The at least three sockets or bores 270 are adapted to receive a centering element 210 having a rounded tip 290 (FIGS. 13-15). The at least three sockets or bores 270 are preferably located at an equal distance from one another on the inner edge 172 of the guard ring 170, such that each of the three sockets or bores 270 are 120 degrees from one another. It can be appreciated that more than at least three sockets or bores 270 can be used, e.g. at least six (6), at least twelve (12) or at least eighteen (18).

Figure 12:
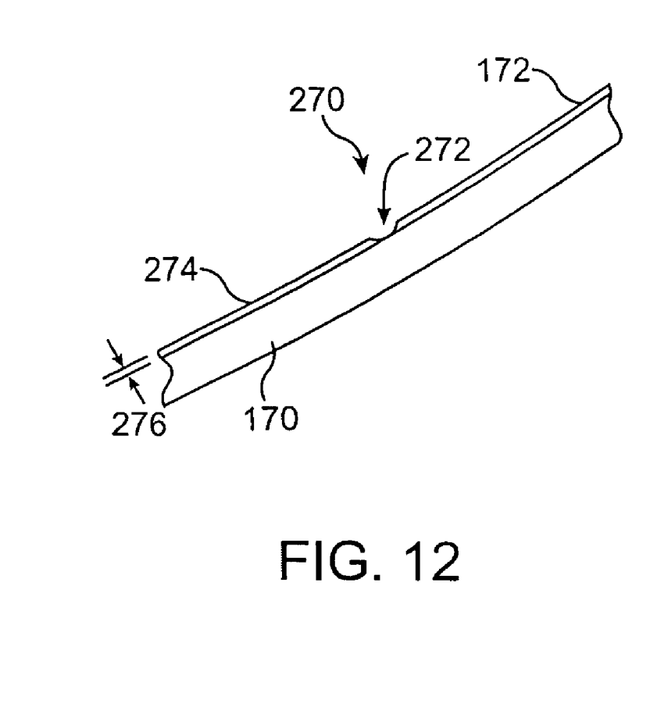
FIG. 12 shows an exploded view of the guard ring of FIG. 11.

FIG. 12 shows a portion of the guard ring of FIG. 11 and the socket or bore 270. As shown in FIG. 12, the socket or bore 270 includes a groove 272, which is adapted to receive a centering element 210 having a rounded tip 290 (FIG. 13). The groove 272 can extend the height of the inner edge 172 of the guard ring 170, or alternatively, the inner edge 172 can include a spherical groove adapted to receive the rounded tip 290 of the centering element 210, or a combination therein of, wherein the groove 272 does not extend to the entire length of the inner edge 172 of the guard ring 170.

In an alternative embodiment, as shown in FIG. 12, the inner edge 172 of the guard ring 170 can include a liner 274 having a width 276 of about 0.018 to 0.022 inches, and more preferably about 0.020 inches. The liner 274 preferably is positioned within the inner edge 172 of the guard ring 170 and forms the groove 270, by an absence of the liner 274 in those locations about the inner edge 172.

FIG. 13 shows a cross-sectional view of a centering element 210 in accordance with another embodiment having a cylindrical body 280 and a rounded tip 290. As shown in FIG. 13, the centering element 210 includes a hollow cylindrical body 280 (FIG. 15) having a first end 282 with a rounded tip 290, and a second end 284. The second end 284 is open to receive a spring or spring-like element 224 (FIG. 7). In accordance with one embodiment, the centering element 210 has an overall height 286 of about 1.38 to 1.44 inches and more preferably about 1.41 inches.

FIG. 14 shows a bottom view of the second end 284 of the centering element 210 of FIG. 13. As shown in FIG. 14, the second end 284 has an inner diameter 292 of about 0.196 to 0.206 inches, and more preferably about 0.199 to 0.202 inches, and most preferably about 0.199 inches. In addition, the outer diameter 294 of the second end 284 is preferably about 0.242 to 0.254 inches, and more preferably about 0.248 to 0.251 inches, and most preferably about 0.248 inches.

FIG. 15 shows a cross-sectional view of the centering element 210 of FIG. 13 along the lines 15-15. As shown in FIG. 15, the centering element 210 includes a hollow cylindrical body 280, a first end 282, a second end 284, and a rounded tip 290. The second end 284 is open and is adapted to receive a spring or spring-like element 224. The second end 284 can also include a chamfered or angled inner edge 296. The rounded tip 290 preferably has a spherical radius having a diameter of about 0.120 to 0.140 inches, and more preferably about 0.130. The first end 282 preferably has a diameter 294 of about 0.242 to 0.254 inches, and more preferably about 0.248 to 0.251 inches, and most preferably about 0.248 inches. The first end 282 also preferably includes a slightly rounded edge.

As shown in FIG. 15, the centering element 210 includes a cavity 298 adapted to receive a spring or spring-like member 224. The cavity 298 extends from the second end 284 of the centering element 210 towards the first end 282. In accordance with one embodiment, the cavity 298 preferably has a height 287 of approximately 1.000 to 1.100 inches, and more preferably about 1.055 inches. The first end 282 of the centering element 210 is preferably solid or semi-solid with a height 285 of about 0.330 to 0.390 inches and more preferably about 0.355 inches.

Figure 17:
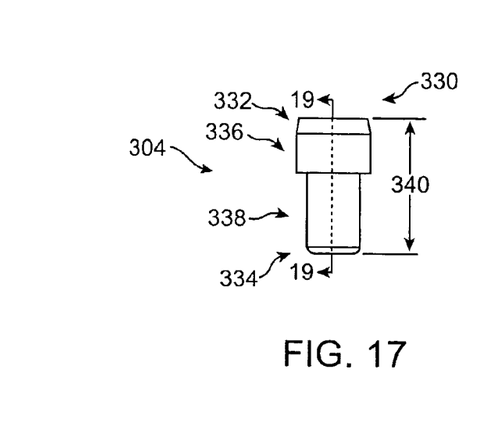
FIG. 17 shows a side view of a lower portion of a centering element in accordance with a further embodiment.
Figures 18, 20:
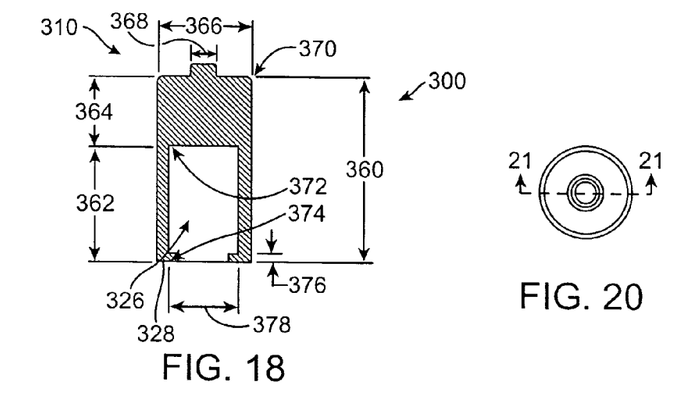
FIG. 18 shows a cross-sectional view of the upper portion of the centering element of FIG. 16 along the lines 18-18.
FIG. 20 shows a top view of the upper portion of the centering element of FIG. 16.
Figures 19, 21:
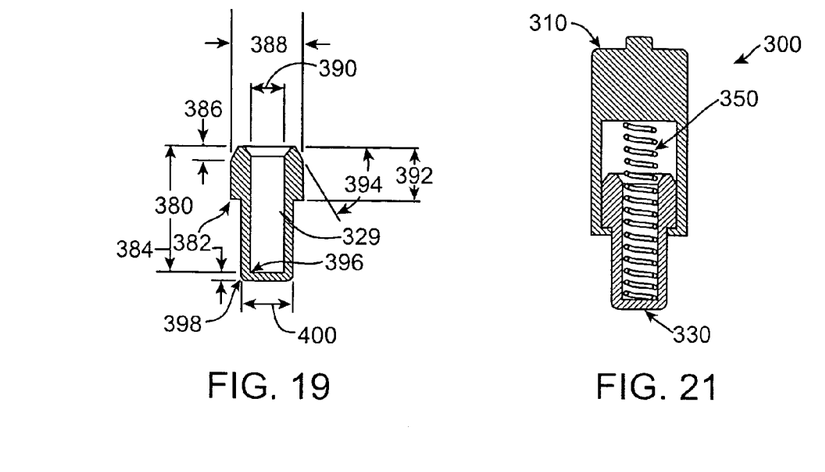
FIG. 19 shows a cross-sectional view of the lower portion of the centering element of FIG. 17 along the lines 19-19.
FIG. 21 shows a cross-sectional view of the centering element of FIGS. 16 and 17 along the lines 18-18 and 19-19, respectively with a spring element.

FIGS. 16-21 show a series of side views and cross sectional views of a centering element 300 in accordance with a further embodiment. As shown in FIGS. 16-21, the centering element 300 is comprised of an upper portion 302 (FIG. 16), a lower portion 304 (FIG. 17), and a spring or spring-like element 350 (FIG. 21).

Figure 16:
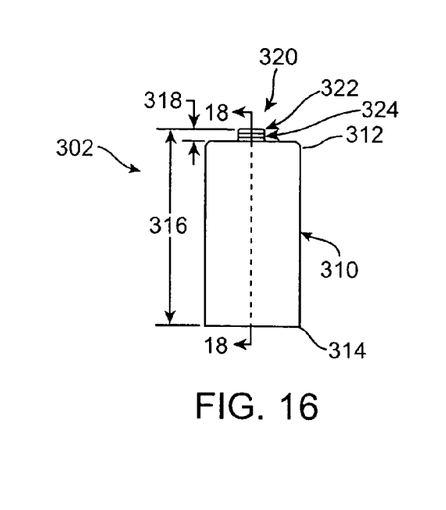
FIG. 16 shows a side view of an upper portion of a centering element in accordance with a further embodiment, which is adapted to be assembled with a lower portion of the centering element as shown in FIG. 17.

FIG. 16 shows a side view of the upper portion 302 of the centering element 300. As shown in FIG. 16, the upper portion 302 is comprised of a cylindrical body 310 having a first end 312 with a cylindrical tip 320, and a second end 314. The second end 314 preferably includes a flange or inner ridge 328, which is adapted to receive the cylindrical insert 330 (FIG. 17) such that the cylindrical insert 330 is retained within a cavity or hollow portion 326 of the cylindrical body 310. A spring-like element or elastic element 350 (FIG. 21) fits within the cavity or hollow portions 326, 329 of the cylindrical body 310 and the cylindrical insert 330, respectively.

The centering element 300 comprised of the upper portion 302 and the lower portion 304 has an overall height of about 0.68 to 0.76 inches and more preferably about 0.72 inches. The cylindrical body 310 has a height 316 of between about 0.49 and 0.57 inches and more preferably about 0.53 inches. The cylindrical tip 320 has a height 318 of between about 0.028 and 0.032. The cylindrical tip 320 is preferably comprised of an upper segment 322 and a lower segment 324 having a radius between 0.005 and 0.010 inches, and 0.005 and 0.015 inches, respectively.

FIG. 17 shows a side view of the lower portion 304 of the centering element 300. As shown in FIG. 17, the lower portion 304 is comprised of a cylindrical insert 330 comprised of an upper portion 332 and a lower portion 334 having a first outer diameter 336 and a second outer diameter 338, wherein the first outer diameter of the upper portion 332 is greater than the outer diameter of the lower portion 334, such that the upper portion is retained within the hollow portion 326 of the cylindrical body 310 of the upper portion 302. The cylindrical insert 330 preferably has an overall height 340 of between about 0.34 and 0.38 inches and more preferably about 0.36 inches.

FIG. 18 shows a cross-sectional view of the upper portion 302 of the centering element 300 of FIG. 16 along the lines 18-18. As shown in FIG. 18, the upper portion 302 of the centering element 300 includes a cavity 326 adapted to receive a spring or spring-like member 350. The cavity 326 has an upper edge 372 and a lower edge 374. The lower edge 374 of the cavity 326 is an upper surface of the flange or inner ridge 328 on the second end 314 of the centering element 300. The flange or inner ridge 328 is adapted to retain the cylindrical insert 330 and spring element 350 within the cavity 326 of the upper portion 302 of the centering element 300 during use.

In accordance with one embodiment as shown in FIG. 18, the cylindrical body 310 has an overall height 360 extending from the first end 312 to the second end 314 of approximately 0.500 inches. The cylindrical body 310 includes a solid portion on the first end and a cavity portion nearest the second end 314. The cavity 326 has an overall height 362 of about 0.31 inches with the solid portion having a height 364 of about 0.19 inches. The cylindrical body 310 has an outer diameter 366 of approximately 0.248 inches. In accordance with one embodiment, the cylindrical tip 320 preferably has an outer diameter 368 on the tip of approximately 0.070 inches.

FIG. 19 shows a cross-sectional view of the lower portion 304 of the centering element 300 of FIG. 17 along the lines 19-19. As shown in FIG. 19, the lower portion 304 is comprised of a cylindrical insert 330 comprised of an upper portion 332 and a lower portion 334 having a first outer diameter 336 and a second outer diameter 338. The first outer diameter of the upper portion 332 is preferably greater than the outer diameter of the lower portion 334, such that the upper portion is retained within the hollow portion 326 of the cylindrical body 310 of the upper portion 302. The intersection of the upper portion 332 and the lower portion 334 forms a ridge 382 around the outer surface of the cylindrical insert 330. In accordance with one embodiment, the cylindrical insert 330 preferably has an overall height 340 of between about 0.34 and 0.38 inches and more preferably about 0.36 inches with the upper portion 336 having a height 392 of about 0.140 to 0.150 inches, and more preferably about 0.145 inches. The lower portion 304 comprises a cylindrical insert 330 having a cavity 329 therein. The cavity 329 has an inner diameter 390 of approximately 0.091 inches to approximately 0.097 inches. The outer diameter 388 of the upper portion 302 is approximately 0.194 to 0.200 inches, and includes an angled surface 394, which is approximately 80 degree angle to the horizontal and having a height 386 of approximately 0.03 to 0.05 inches and more preferably about 0.04 inches. The lower portion 338 has an outer diameter 400 of approximately 0.141 inches to approximately 0.144 inches. The cavity 329 has a height 380 of approximately 0.340 inches, and a thickness 384 of approximately 0.025 inches with an inner radius 396 of approximately 0.005 inches and an outer radius 398 of approximately 0.02 inches.

FIG. 20 shows a top view of the centering element of FIG. 16. In accordance with one embodiment, as shown in FIG. 20, the second end 314 has an inner diameter 378 of about 0.196 to 0.206 inches, and more preferably about 0.199 to 0.202 inches, and most preferably about 0.199 inches. In addition, the outer diameter 366 of the second end 314 is preferably about 0.242 to 0.254 inches, and more preferably about 0.248 to 0.251 inches, and most preferably about 0.248 inches.

FIG. 21 shows a cross-sectional view of the centering element 300 of FIGS. 16 and 17 along the lines 18-18 and 19-19, respectively. As shown in FIG. 21 the spring element 350 is received within the hollow portions or cavities 326, 329 of the cylindrical body 310 and the cylindrical inserts 330. It can be appreciated that the centering elements 300 are retained in the backing plate bores 212 during removal of the guard ring 170 as a result of a suction effect created between the inner diameter 378 of the cylindrical body 310 and the outer diameter 388 of the cylindrical insert 330. The volume 326 of the cylindrical body 310 acts as a damper to regulate the relative acceleration between the cylindrical body 310 and the cylindrical insert 330 to an acceptable magnitude during the removal of the guard ring 170. The acceptable acceleration magnitude prevents the centering elements 300 from shooting out of the backing plate bores 212 and retains them within the backing plate during the removal of the guard ring 170.

Figure 22:
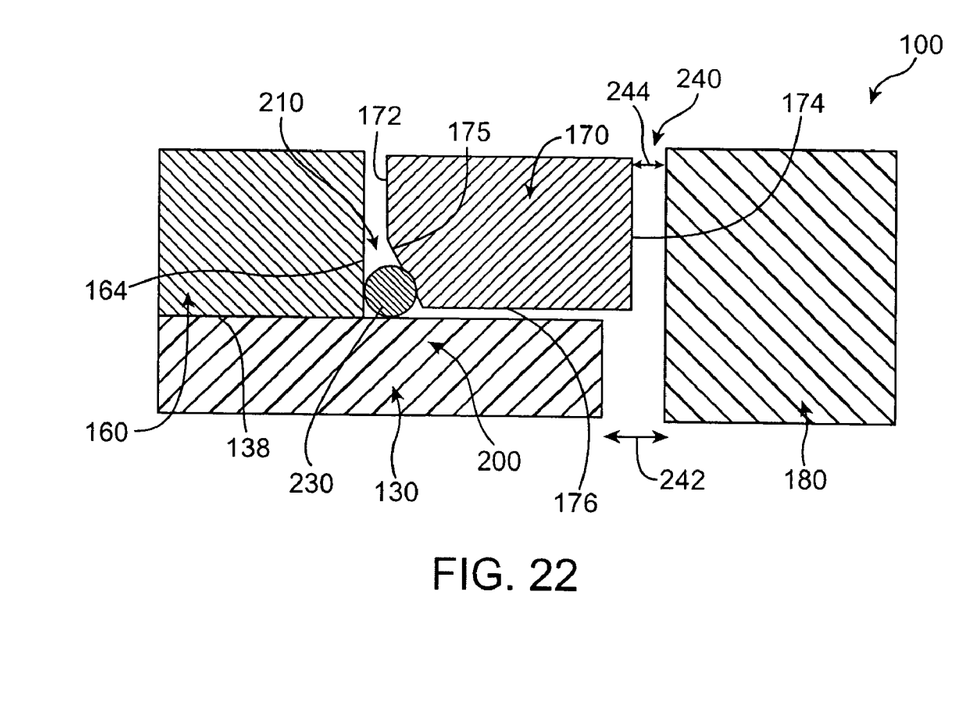
FIG. 22 shows a cross-sectional view of a portion of the outer electrode assembly having a guard ring in accordance with another embodiment.

FIG. 22 shows a cross-sectional view of a portion of the outer electrode 130 having a guard ring 170 surrounding an outer upper backing member 160 in accordance with another embodiment. As shown in FIG. 22, the system includes a guard ring 170 with an angled lower edge 175 (or chamfered surface) extending from the inner edge 172 to the lower surface 176 of the guard ring 170. A centering element 210 in the form of a circular ring 230 is positioned between the outer edge 164 of the outer electrode 160 and the angled lower edge 175 of the guard ring 170 and is positioned on an upper surface 138 of the outer electrode 130. The circular ring 230 is preferably a hollow ring made of Teflon® (polytetrafluoroethylene (PTFE)), a fluoropolymer material, a polyimide, or other suitable polymeric or polymeric-like material. It can be appreciated that if a PTFE material cannot be used due to other factors, a material with the lowest coefficient of friction is preferred. The circular ring 230 is utilized to maintain a uniform gap 200 between the outer backing member and the guard ring 170 about its full circumference during thermal expansion and contraction of the backing member and the guard ring during use 170.

It can be appreciated that the circular ring 230 allows the guard ring 170 to self center itself, due to its own weight. The circular ring 230 also blocks any line-of-sight or gas flow path to the upper electrode bond (not shown) and outer conical surface, which shields the upper electrode bond from free radical and ion bombardment erosion from the plasma. In addition, the circular ring protects the outer surface 164 of the backing plate 160 from free radical and ion bombardment exposure from the plasma, and associated aluminum fluoride formation.

Figure 23:
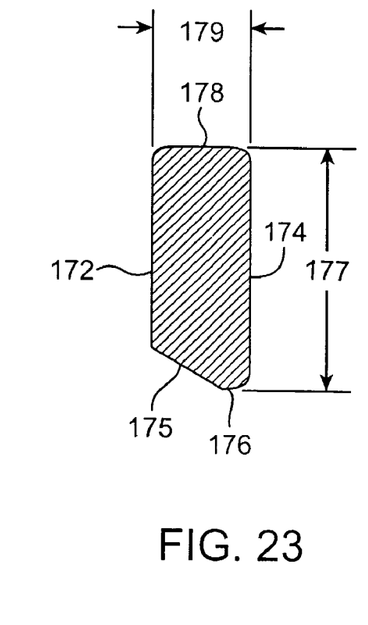
FIG. 23 shows a cross-sectional view of the guard ring as shown in FIG. 22.

FIG. 23 shows a cross-sectional view of the guard ring 170 as shown in FIG. 22. As shown in FIG. 23, the guard ring 170 has an angled lower edge 175 (or chamfered surface) extending from the inner edge 172 to the lower surface 176. The inner edge 172 and the outer edge 174 preferably have a height 177 of about 0.332 to 0.372 inches, and more preferably about 0.342 to 0.362 inches and most preferably about 0.352 inches, and a width 179 of about 0.140 to 0.150 inches, and more preferably about 0.142 and 0.147 inches, and most preferably about 0.145 inches. The angled lower edge 175 extends from the inner edge 172 to the outer edge 174 for a distance of about 0.090 to 0.110 inch and more preferably about 0.100 inch and forms an angle with the inner edge of approximately 50 to 70 degrees and more preferably about 60 degrees. The corners between the inner edge 172, the outer edge 174, the lower surface 176, the upper surface 178, and the angled lower edge 175 are preferably rounded having a radius of between about 0.025 and 0.010 inches. It can be appreciated that at the corner where the inner edge 172 and the lower edge 175 meet, the corner includes an edge break of about 0.005 inches maximum.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents, which fall within the range of the claims, are intended to be embraced therein.

What is claimed is:

1. An electrode assembly for a plasma reaction chamber used in semiconductor substrate processing comprising:
    an upper electrode;
    a backing member, the backing member attachable to an upper surface of the upper electrode;
    an outer ring surrounding an outer surface of the backing member, wherein the outer ring is configured to provide an inner gap between the outer surface of the backing member and an inner surface of the outer ring; and
    at least one centering element positioned between the outer surface of the backing member and the inner surface of the outer ring.

2. The assembly of claim 1, wherein; (a) the at least one centering element comprises a plurality of centering elements having first ends in contact with the outer ring and second ends supporting springs in contact with the backing member; (b) the at least one centering element comprises a plurality of centering elements received in cavities in the outer surface of the backing member; (c) the outer ring consists of quartz; (d) the backing member consists of aluminum or an aluminum alloy; and/or (e) the upper electrode comprises an inner electrode and an outer electrode.

3. The assembly of claim 2, wherein the outer electrode is a segmented member comprising a plurality of segments forming an outer electrode ring and having an overlapping surface at an interface of each of the plurality of segments.

4. The assembly of claim 1, wherein: (a) the backing member comprises an inner backing member and an outer backing member; (b) a bonding material attaches the upper surface of the upper electrode to the backing member; (c) the upper electrode consists of silicon; (d) the at least one centering element comprises a plurality of centering elements which are spring-loaded centering elements having a reticulating ball member at one end thereof; and/or (e) the at least one centering element comprises three or more spring-loaded elements positioned symmetrically around the outer surface of the backing member.

5. The assembly of claim 1, wherein the at least one centering element comprises a plurality of centering elements each of which comprises a cylindrical body having a cavity therein and a cylindrical insert having a cavity therein, wherein a spring is contained within the cavities within the cylindrical member and the cylindrical insert.

6. The assembly of claim 5, wherein the cylindrical body has a cylindrical tip which contacts the outer ring.

7. The assembly of claim 1, wherein the at least one centering element comprises a centering ring.

8. The assembly of claim 7, wherein: (a) the centering ring is hollow; (b) the outer ring has a generally rectangular cross-section with a lower angled surface in contact with the centering ring; (c) the backing member consists of aluminum or an aluminum alloy; and/or (d) the outer ring consist of quartz.

9. The assembly of claim 1, wherein the at least one centering element comprises a plurality of centering elements which are spring-loaded centering elements having a reticulating ball member at one end thereof.

10. The assembly of claim 9, wherein the at least one centering element comprises three or more spring-loaded elements positioned symmetrically around the outer surface of the backing member.

11. A guard ring assembly for use in an electrode assembly of a plasma reaction chamber used in semiconductor substrate processing wherein the electrode assembly includes a showerhead electrode bonded to a backing member and a confinement ring assembly surrounds the electrode assembly, the guard ring assembly comprising:
    a guard ring configured to fit between an outer periphery of the backing member and an inner periphery of the confinement ring assembly, and wherein the outer ring is configured to provide an inner gap between the outer periphery of the backing member and an inner periphery of the guard ring; and
    at least one centering element adapted to center the guard ring around the outer periphery of the backing member.

12. The assembly of claim 11, wherein the at least one centering element comprises a plurality of centering elements having first ends in contact with the guard ring and second ends supporting springs which cooperate to center the guard ring around the outer periphery of the backing member.

13. The assembly of claim 12, wherein each of the centering elements is received in a cavity on the outer periphery of the backing member.

14. The assembly of claim 11, wherein the at least one centering element comprises a centering ring.

15. The assembly of claim 14, wherein the centering ring is a compressible ring and a portion of the inner periphery of the guard ring urges the compressible ring against the outer periphery of the backing member and against an upper surface of the electrode.

16. The assembly of claim 11, wherein the at least one centering element comprises a plurality of centering elements each of which includes a hollow body having a roller at one end thereof in contact with the guard ring and a cavity at the other end receiving a spring element which contacts the backing member.

17. The assembly of claim 11, wherein the at least one centering element comprises a plurality of centering elements each of which includes a tip at one end thereof, the guard ring having a plurality of recesses, each of the recesses receiving a respective one of the tips of the centering elements.

18. The assembly of claim 11, wherein the guard ring is of quartz and optionally includes a coating on the inner periphery thereof.

19. The assembly of claim 11, wherein the at least one centering element comprises a plurality of centering elements which are spring-loaded centering elements having a reticulating ball member at one end thereof.

20. The assembly of claim 19, wherein the at least one centering element comprises three or more spring-loaded elements positioned symmetrically around the outer periphery of the backing member.

21. An electrode assembly for a plasma reaction chamber used in semiconductor substrate processing comprising:
    an upper electrode;
    a backing member, the backing member attachable to an upper surface of the upper electrode;
    an outer ring surrounding an outer surface of the backing member, wherein the outer ring is configured to provide an inner gap between the outer surface of the backing member and an inner surface of the outer ring; and
    a plurality of spring-loaded centering elements having a reticulating ball member at one end thereof, which are positioned symmetrically around the outer surface of the backing member.

* * * * *